United States Patent
Su et al.

(10) Patent No.: US 8,143,780 B2
(45) Date of Patent: Mar. 27, 2012

(54) ORGANIC ELECTROLUMINESCENT STRUCTURE HAVING A RED COLOR LUMINESCENT-ELECTRON TRANSPORT LAYER

(75) Inventors: Ying-Ju Su, Hsin-Chu (TW); Chen-Ping Yu, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 650 days.

(21) Appl. No.: 11/953,088

(22) Filed: Dec. 10, 2007

(65) Prior Publication Data

US 2008/0258611 A1    Oct. 23, 2008

(30) Foreign Application Priority Data

Apr. 19, 2007    (TW) ................... 96113807 A

(51) Int. Cl.
*H01L 51/50* (2006.01)
*H01L 51/52* (2006.01)

(52) U.S. Cl. ..................................... 313/504
(58) Field of Classification Search .......... None
See application file for complete search history.

(56) References Cited

U.S. PATENT DOCUMENTS

| | | | |
|---|---|---|---|
| 5,281,489 A * | 1/1994 | Mori et al. ............ | 428/690 |
| 5,343,050 A * | 8/1994 | Egusa et al. ............ | 257/40 |
| 2003/0054186 A1 | 3/2003 | Miyashita et al. | |
| 2003/0098444 A1 * | 5/2003 | Okunaka et al. ...... | 252/301.16 |
| 2005/0057150 A1 | 3/2005 | Kim et al. | |
| 2005/0208205 A1 | 9/2005 | Haase | |
| 2005/0280355 A1 | 12/2005 | Lee | |
| 2006/0159951 A1 | 7/2006 | Falcou | |
| 2007/0120467 A1 * | 5/2007 | Feng et al. ............ | 313/504 |

FOREIGN PATENT DOCUMENTS

| | | |
|---|---|---|
| CN | 1599527 A | 3/2005 |
| CN | 1897295 A | 1/2007 |
| TW | 200721901 | 6/2007 |

OTHER PUBLICATIONS

Ultrahigh Energy Gap Hosts in Deep Blue Organic Electrophosphorescent Devices; Xiaofan Ren, Jian Li, Russell J. Holmes, Peter I. Djurovich, Stephen R. Forrest, and Mark E. Thompson; Chemistry of Materials 2004 16 (23), 4743-4747.*

* cited by examiner

*Primary Examiner* — Toan Ton
*Assistant Examiner* — Britt D Hanley
(74) *Attorney, Agent, or Firm* — Winston Hsu; Scott Margo

(57) ABSTRACT

An organic electroluminescent structure has a first electrode, a first primary color luminescent patterned layer disposed on the first electrode, a second primary color luminescent patterned layer disposed on the first electrode, a third primary color luminescent and electron transport layer disposed on the first electrode, the first primary color luminescent patterned layer and the second primary color luminescent patterned layer, and a second electrode disposed on the third primary color luminescent and electron transport layer.

9 Claims, 13 Drawing Sheets

ORGANIC ELECTROLUMINESCENT STRUCTURE HAVING A RED COLOR LUMINESCENT-ELECTRON TRANSPORT LAYER

BACKGROUND OF THE INVENTION

1. Field of the Invention

The present invention relates to an organic electroluminescent structure and a method of making the same, and more particularly, to an organic electroluminescent structure having a luminescent and electron transport layer that has both effects of the organic luminescence and electron transport and a making method of an organic electroluminescent structure being able to reduce the number of shadow masks used for defining an organic luminescent layer.

2. Description of the Prior Art

Flat displays have advantages of saving electricity, low radiation, and small size over traditional cathode ray tube (CRT) displays. For these reasons, flat displays are replacing CRT displays gradually. With the improvements of flat display techniques, the price of flat displays is getting lower. Therefore, flat displays are more popular and undergoing developments for larger sizes. Because of having the advantages of high contrast and self-luminosity, the organic electroluminescence display is a most remarkable product among the flat displays at present.

Please refer to FIG. 1. FIG. 1 is a cross-sectional schematic diagram illustrating a conventional organic electroluminescent structure of a pixel region in an organic electroluminescent panel. As shown in FIG. 1, the conventional organic electroluminescent structure includes an anode 10, a hole injection layer 12 disposed on the anode 10, a hole transport layer 14 disposed on the hole injection layer 12, an organic luminescent matrix 16 disposed on the hole transport layer 14, an electron transport layer 18 disposed on the organic luminescent matrix 16, and a cathode 20 disposed on the electron transport layer 18.

In order to display a full color frame, the organic electroluminescent structure of any pixel region in the organic luminescent panel includes blue sub-pixel, a green sub-pixel and a red sub-pixel, and the organic electroluminescent matrix 16 includes a blue organic luminescent pattern 16B, a green organic luminescent pattern 16G and a red organic luminescent pattern 16R, wherein the blue organic luminescent pattern 16B is in charge of providing luminescence of the blue sub-pixel, the green organic luminescent pattern 16G is in charge of providing luminescence of the green sub-pixel, and the red organic luminescent pattern 16R is in charge of providing luminescence of the red sub-pixel so as to combine a beautiful full color frame.

An evaporation process combined with shadow masks is used to form the organic luminescent matrix 16, and for the organic luminescent matrix 16 of the conventional organic electroluminescent structure, the blue organic luminescent pattern 16B, the green organic luminescent pattern 16G and the red organic luminescent pattern 16R have to respectively use three shadow masks to perform evaporation. First, in the manufacturing process, because the alignment deviation will be generated unpreventably while using the shadow masks, the conventional making method for the organic luminescent matrix 16 of the organic electroluminescent structure has to use three shadow masks so as to increase a risk of alignment deviation. The alignment deviation of the organic luminescent matrix 16 will generate some problems, such as a shadow effect etc., so that the displaying quality is bad. In addition, when a size of the required organic electroluminescent panel is large, a large shadow mask should be used. The large shadow mask will easily generate a bending effect, and the pattern conversion of the organic luminescent matrix 16 also will generate deviation.

Therefore, to reduce the using number of shadow masks so as to prevent the disadvantages to the organic electroluminescent structure produced by alignment deviation is an important object in present research of the organic electroluminescent structure.

SUMMARY OF THE INVENTION

It is therefore an object to provide an organic electroluminescent structure and a method of making the same so as to increase device stability and simplify processing.

According to the claimed invention, an organic electroluminescent structure is provided. The organic electroluminescent structure comprises a first electrode, a first primary color luminescent patterned layer disposed on the first electrode and generating a first primary color light, a second primary color luminescent patterned layer disposed on the first electrode and generating a second primary color light, a third primary color luminescent and electron transport layer disposed on the first electrode, the first primary color luminescent patterned layer, and the second primary color luminescent patterned layer adapted to generate a third primary color light and transport electron, and a second electrode disposed on the third primary color luminescent and electron transport layer.

According to the claimed invention, a method of making an organic electroluminescent structure is provided. The method comprises providing a substrate, and the substrate comprising a first electrode thereon. Then, a first primary color luminescent patterned layer is formed on the first electrode, and a second primary color luminescent patterned layer is formed on the first electrode. Next, a third primary color luminescent and electron transport layer is formed on the first electrode, the first primary color luminescent patterned layer and the second primary color luminescent patterned layer. Last, a second electrode is formed on the third primary color luminescent and electron transport layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
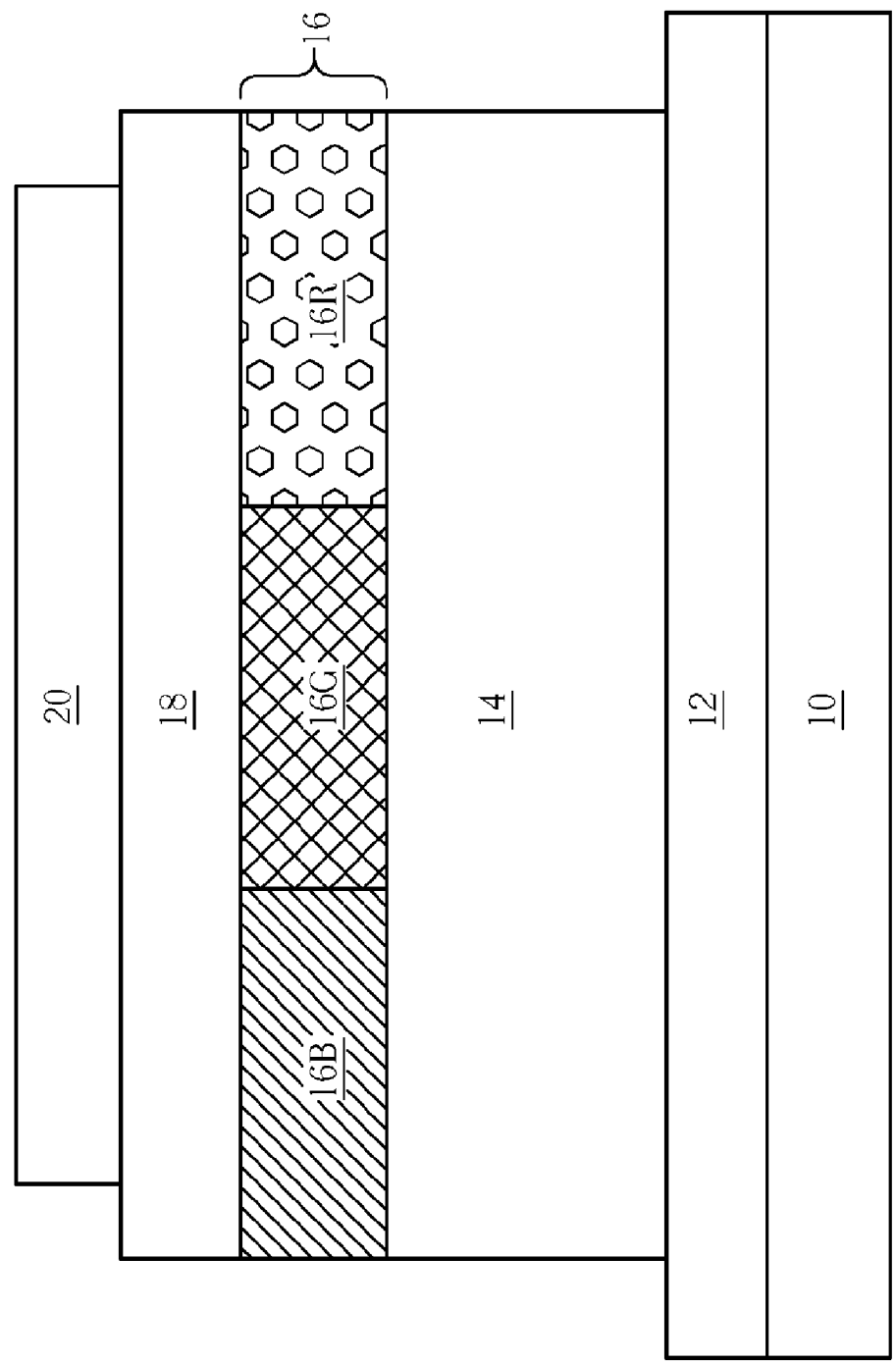
FIG. 1 is a cross-sectional schematic diagram illustrating a conventional organic electroluminescent structure of a pixel region in an organic electroluminescent panel.
Figure 2:
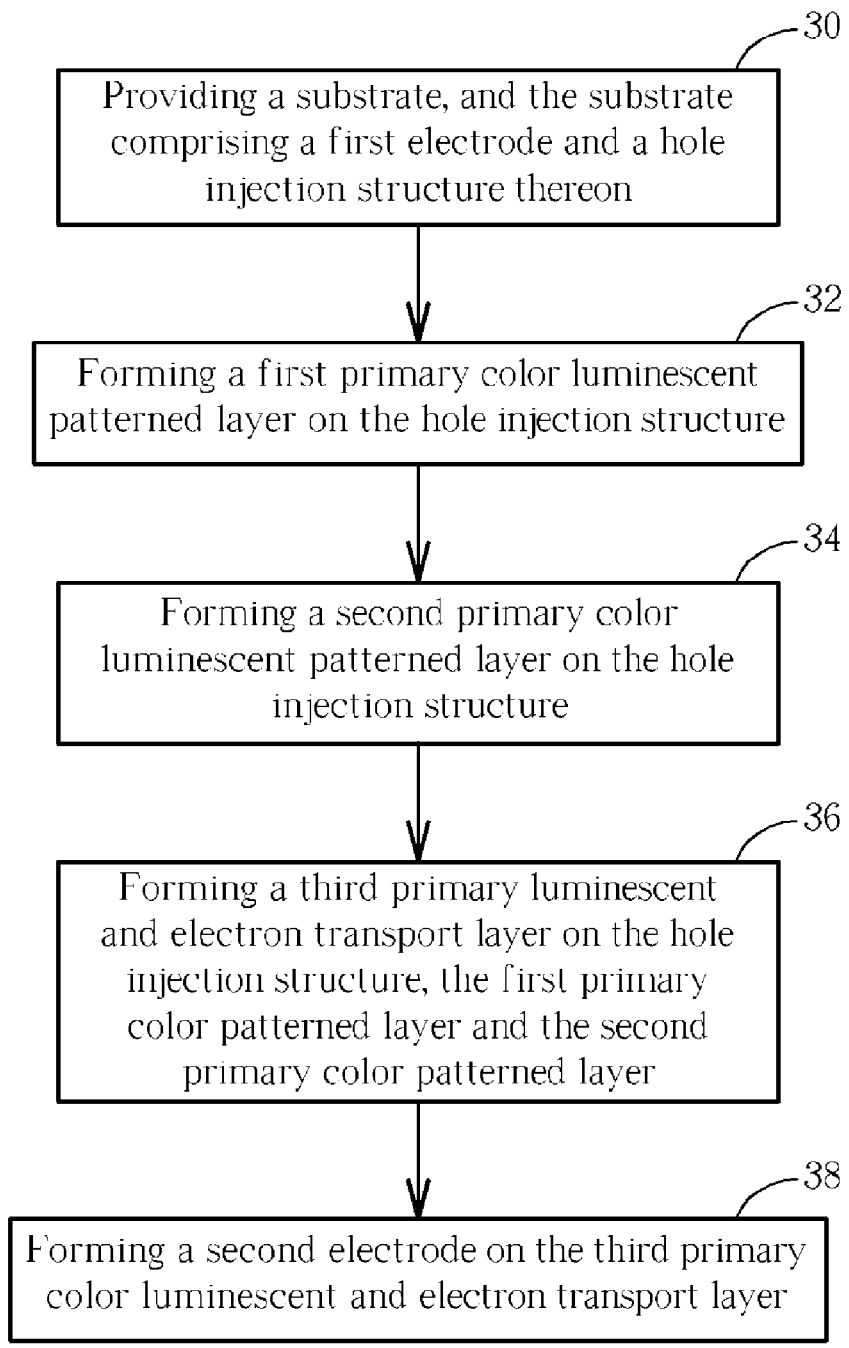
FIG. 2 is a flow chart illustrating a method of making an organic electroluminescent structure according to the present invention.

Please refer to FIG. 2. FIG. 2 is a flow chart illustrating a method of making an organic electroluminescent structure according to the present invention. As shown in FIG. 2, main flow steps of making the organic electroluminescent structure according to the present invention comprise:

Step 30: providing a substrate, and the substrate comprising a first electrode and a hole injection structure thereon;

Step 32: forming a first primary color luminescent patterned layer on the hole injection structure;

Step 34: forming a second primary color luminescent patterned layer on the hole injection structure;

Step 36: forming a third primary luminescent and electron transport layer on the hole injection structure, the first primary color patterned layer and the second primary color patterned layer; and Step 38: forming a second electrode on the third primary color luminescent and electron transport layer.

Figure 3:
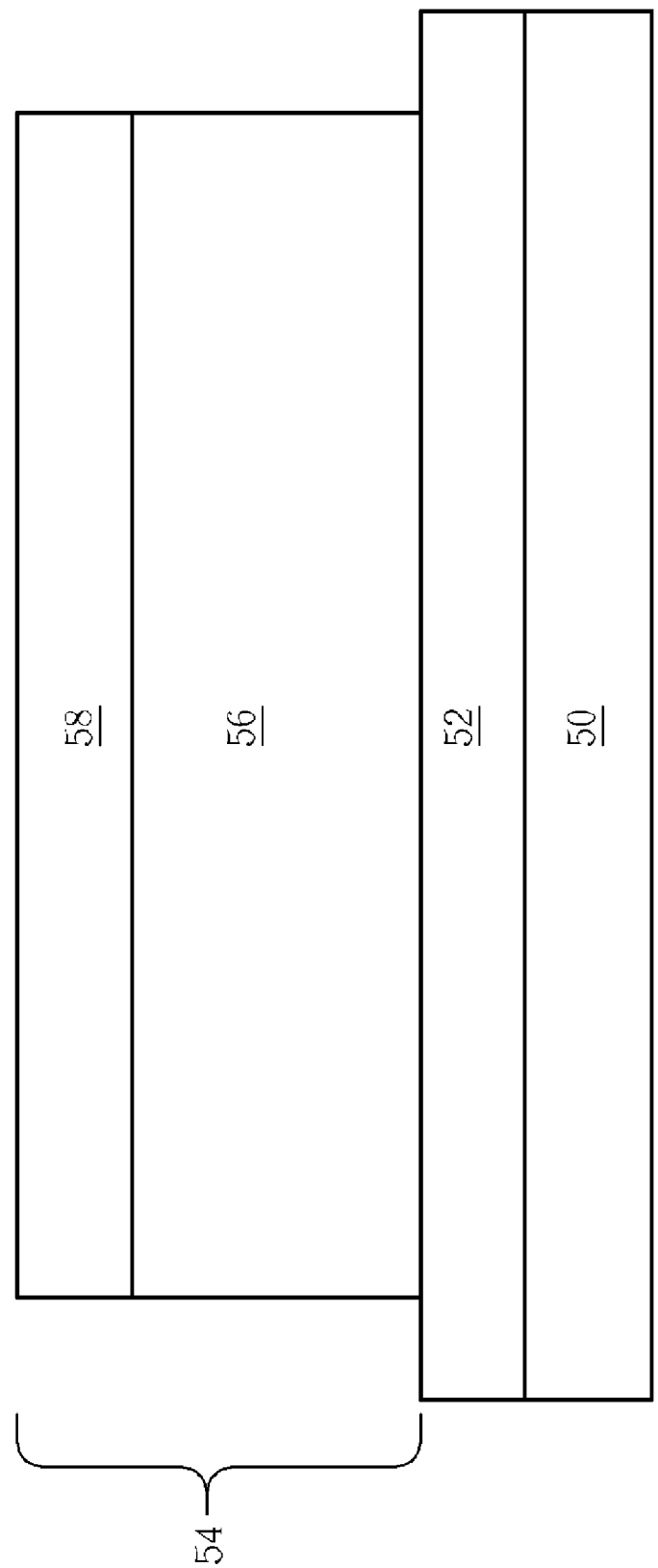
FIG. 3 through FIG. 7 are schematic diagrams illustrating a method of making an organic electroluminescent structure of a pixel region of an organic electroluminescent panel according to a preferred embodiment of the present invention.

In order to further describe the detailed steps of the method of making the organic electroluminescent structure according to the present invention, please refer to FIG. 3 through FIG. 7. FIG. 3 through FIG. 7 are schematic diagrams illustrating a method of making an organic electroluminescent structure of a pixel region of an organic electroluminescent panel according to a preferred embodiment of the present invention. In order to show the characteristics of the present invention, FIG. 3 through FIG. 7 are shown in cross-sectional view. As shown in FIG. 3, a substrate 50 is provided, and the substrate 50 includes a first electrode 52 and a hole injection structure 54 thereon. The substrate 50 can be a transparent substrate, such as glass substrate, quartz substrate or plastic substrate etc. The first electrode 52 is an anode, and the first electrode 52 can be a transparent electrode, such as ITO electrode, or an opaque electrode, such as a metal electrode, depending on the organic electroluminescent display panel being bottom emission or top emission. The hole injection structure 54 includes a hole injection layer 56 and a hole transport layer 58.

Figure 4:
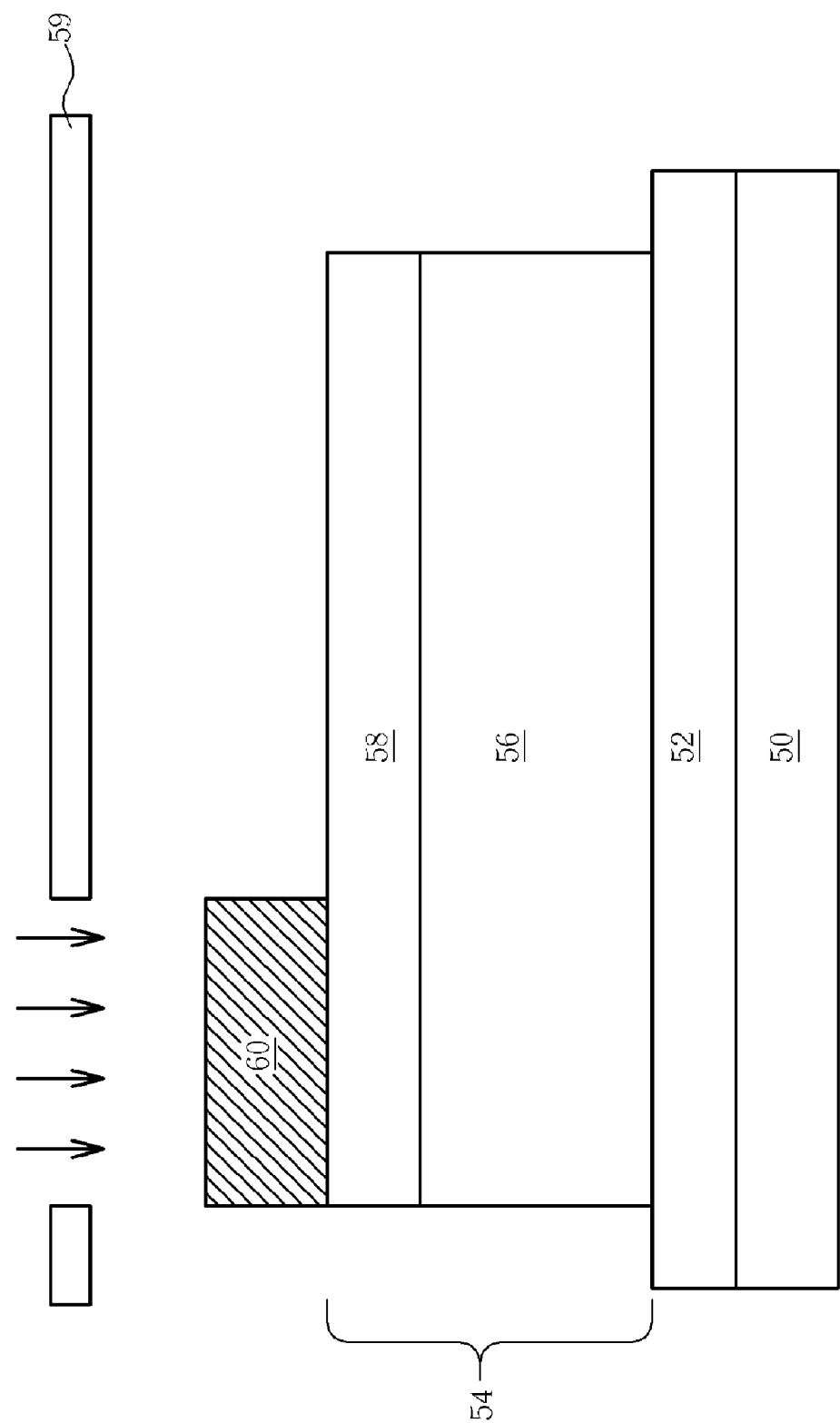

As shown in FIG. 4, an evaporation process is performed with a patterned shadow mask 59, such as a shadow mask, to form a first primary color luminescent patterned layer 60 on the hole injection structure 54. The first primary color luminescent patterned layer 60 is used to emit first primary color light, wherein the first primary color in this embodiment includes blue, and the first primary color light is blue light. Thus, the first primary color luminescent patterned layer 60 is a blue color luminescent patterned layer.

Figure 5:
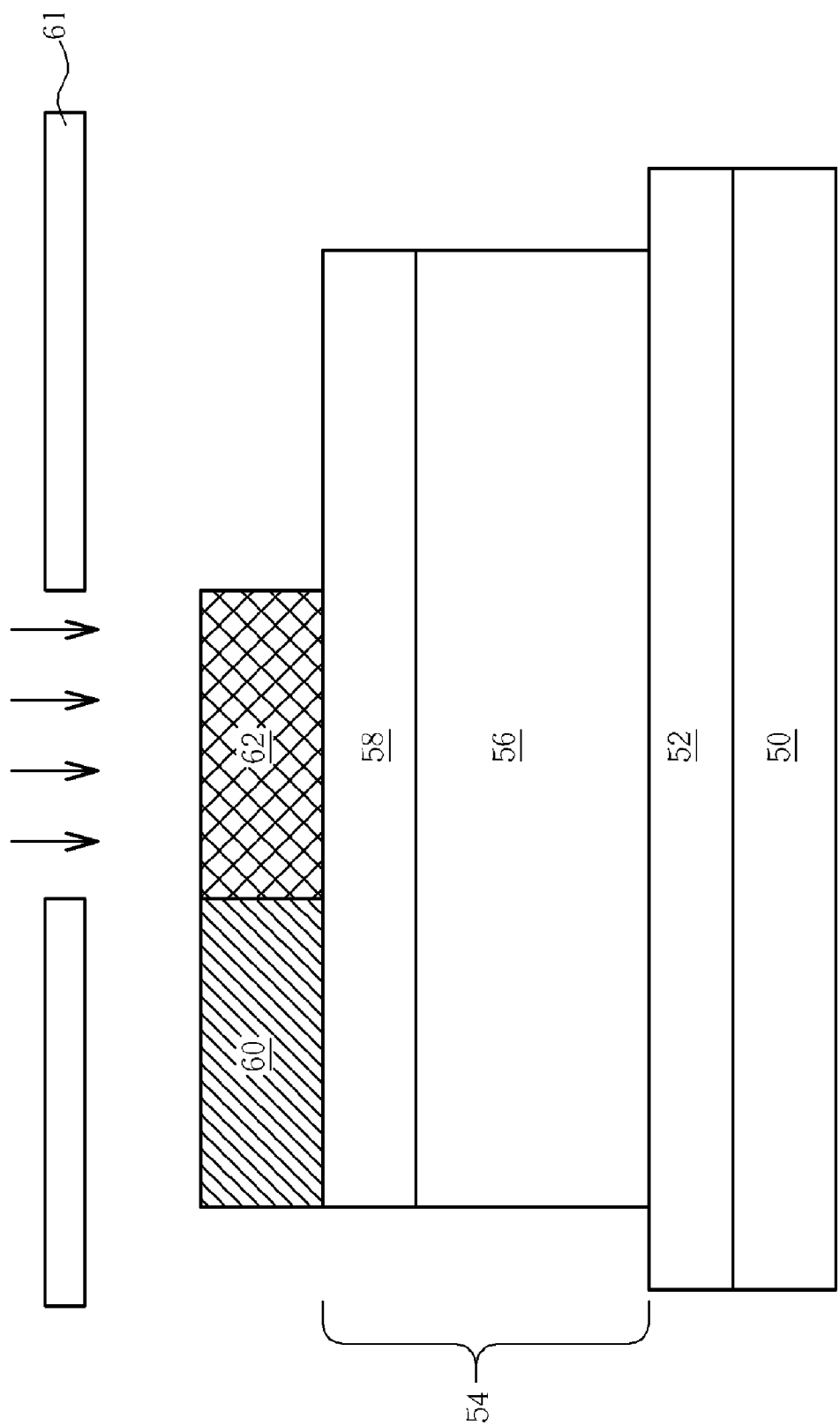

As shown in FIG. 5, next, another evaporation process is performed with another patterned shadow mask 61 to form a second primary color luminescent patterned layer 62 on the hole injection structure 54, wherein the second primary color in this embodiment includes green, and the second primary color light is green light. Thus, the second primary color luminescent patterned layer 62 is a green color luminescent patterned layer.

Figure 6:
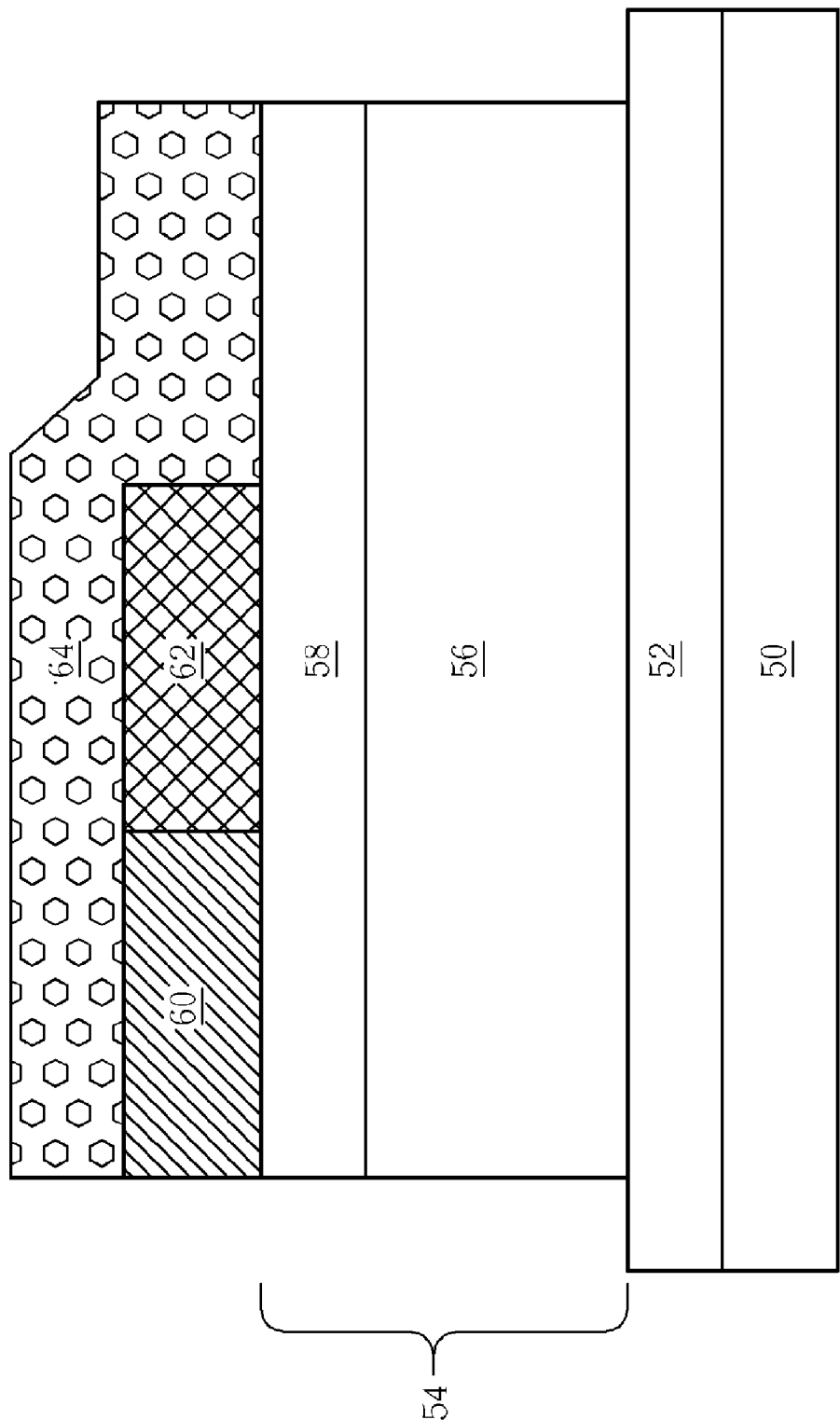

As shown in FIG. 6, next, an evaporation process without any patterned shadow mask to form a third primary color luminescent and electron transport layer 64 on the electron injection structure 54, the first primary color luminescent patterned layer 60 and the second primary color luminescent patterned layer 62. The third primary color luminescent and electron transport layer 64 is adapted to generate a third primary color light and transport electron, wherein the third primary color in this embodiment is red, and the third primary color light is red light. Thus, the third primary color luminescent and electron transport layer 64 is a red color luminescent-electron transport layer. The third primary color luminescent and electron transport layer 64 includes an electron transport host that can have the effect of electron transport, such as TR-E314, and a luminescent dopant that can generate red light, such as RD07.

Figure 7:
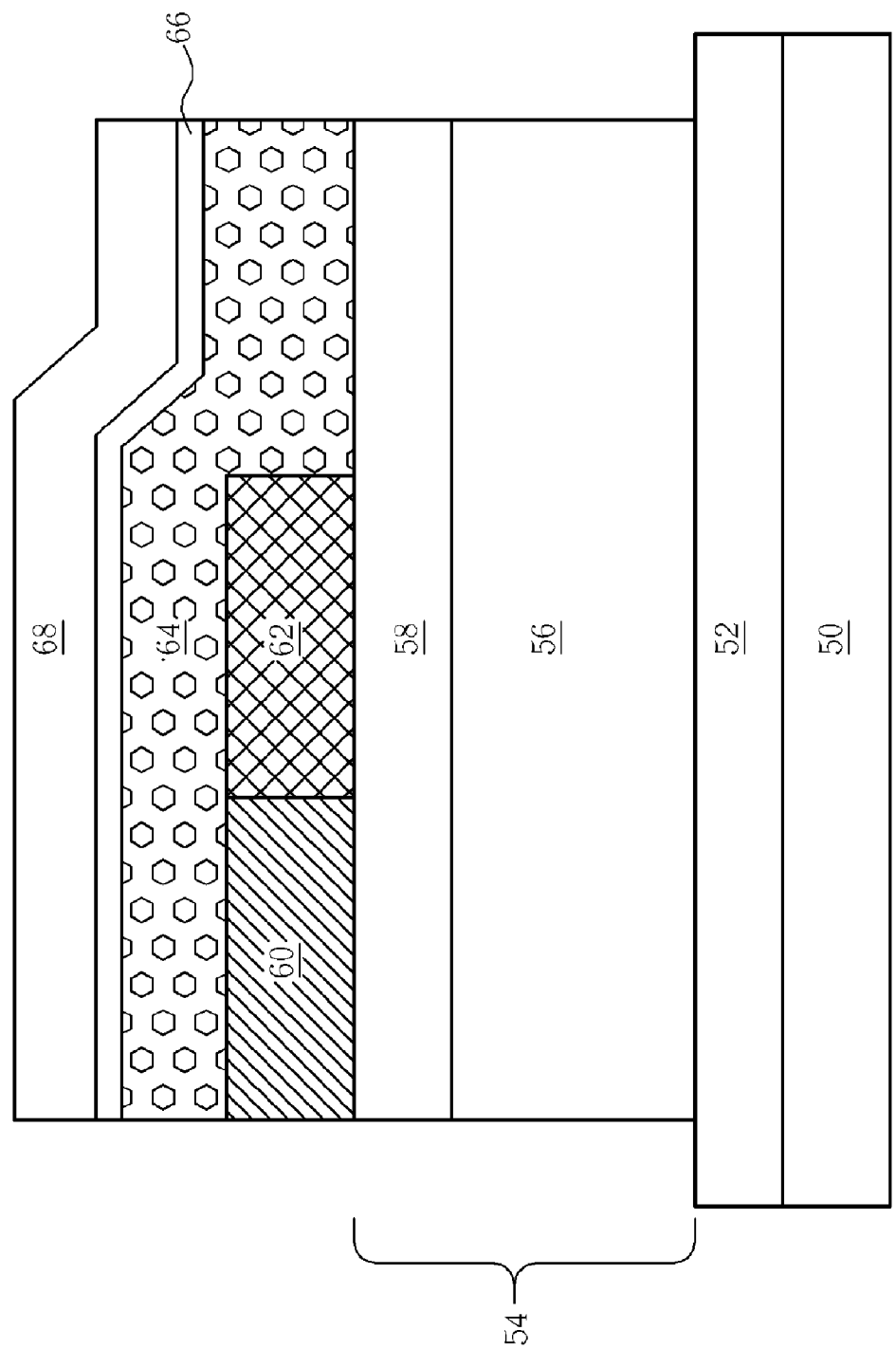

As shown in FIG. 7, last, an electron injection layer 66 and a second electrode (cathode) 68 are respectively formed on the third primary color luminescent and electron transport layer 64, and then the organic electroluminescent structure of the present invention is completed.

One of the characteristics of the present invention is to combine the electron transport layer and the organic luminescent layer into one layer. The luminescent and electron transport layer that has two functions of luminescence and electron transport is completed by using an electron transport host having the function of electron transport and adding the luminescent dopant that can generate some primary color light to the electron transport host so as to reduce the usage of one patterned shadow mask, and the risk of alignment deviation is reduced.

Figure 13:
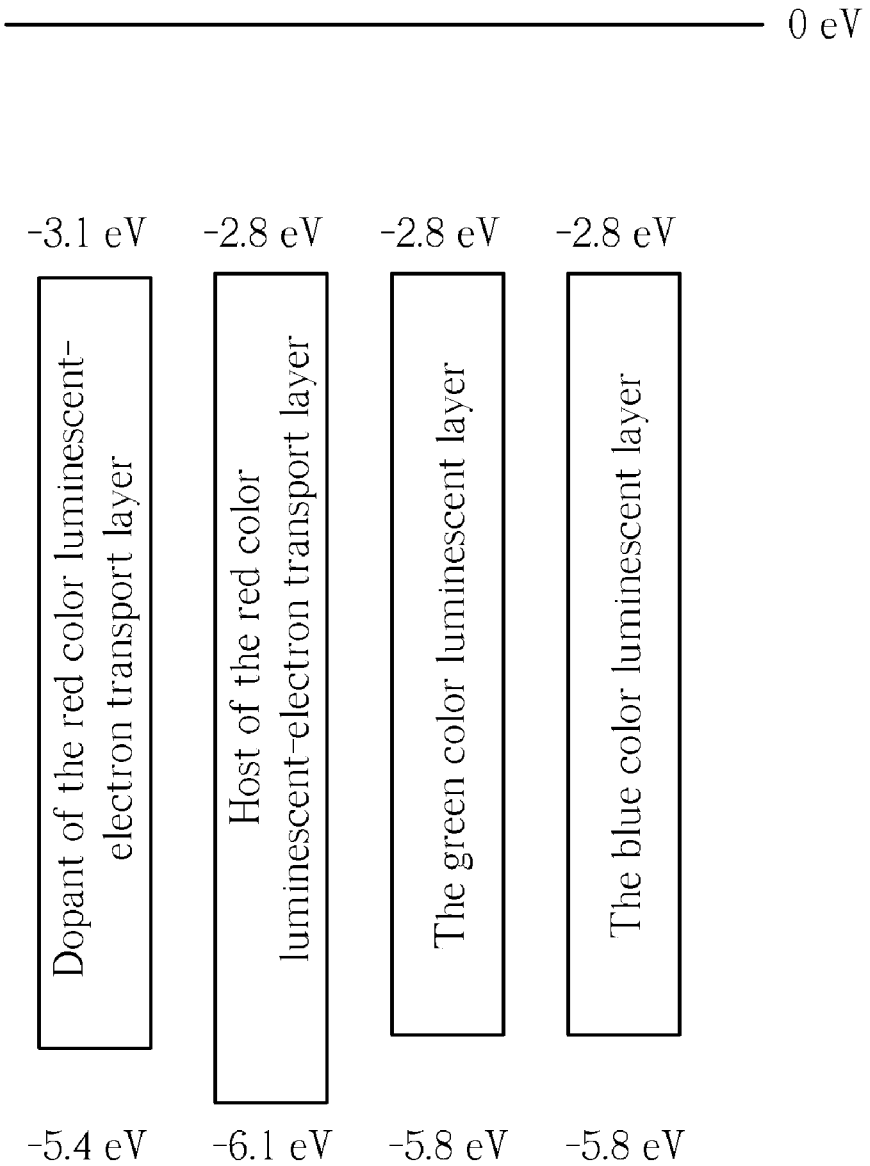
FIG. 13 is an energy band gap diagram of the first primary color luminescent patterned layer, the second primary color luminescent patterned layer, the third primary color luminescent and electron transport layer, the host and the dopant of the third primary color luminescent and electron transport layer.

Please refer to FIG. 13. FIG. 13 is an energy band gap diagram of the first primary color luminescent patterned layer, the second primary color luminescent patterned layer, the third primary color luminescent and electron transport layer, the host and the dopant of the third primary color luminescent and electron transport layer. As shown in FIG. 13, the third primary color luminescent and electron transport layer 64 of the present invention is better composed of a host and a dopant. In choosing the material, the material characteristics of the host and the dopant agreeing with two following conditions is better. First, the highest occupied molecular orbital (HOMO) energy level of the host of the third primary color luminescent and electron transport layer 64 should be lower than or equal to the HOMO energy level of the first primary color luminescent patterned layer 60 and the HOMO energy level of the second primary color luminescent patterned layer 62. For example, the HOMO energy level of the host is −6.1 eV, and the HOMO energy levels of the luminescent material of the first primary color luminescent patterned layer 60 and the second primary color luminescent patterned layer 62 are all −5.8 eV. Second, lowest unoccupied molecular orbital (LUMO) energy level of the host of the third primary color luminescent and electron transport layer 64 is lower than or equal to the LUMO energy level of the first primary color luminescent patterned layer 60 and the LUMO energy level of the second primary color luminescent patterned layer 62. For example, the LUMO energy level of the host of the third primary color luminescent and electron transport layer 64 is −2.8 eV, and the LUMO energy levels of the luminescent materials of the first primary color luminescent patterned layer 60 and the second primary color luminescent patterned layer 62 are all −2.8 eV. In addition, the LUMO energy level of the dopant of the third primary color luminescent and electron transport layer 64 should be lower than the LUMO energy level of the host, and the HOMO energy level of the dopant should be higher than the HOMO energy level of the host. For example, the LUMO energy level of the dopant is −3.1 eV, and the HOMO energy of the dopant is −5.4 eV.

This embodiment takes two materials as an example. For example, TR-E314 of the Torey Company is used to be host, and RD07 of Universal Display Corporation Company is used to be dopant. The host and the dopant are not limited to the above-mentioned materials and also can be replaced by other suitable materials.

Figure 8:
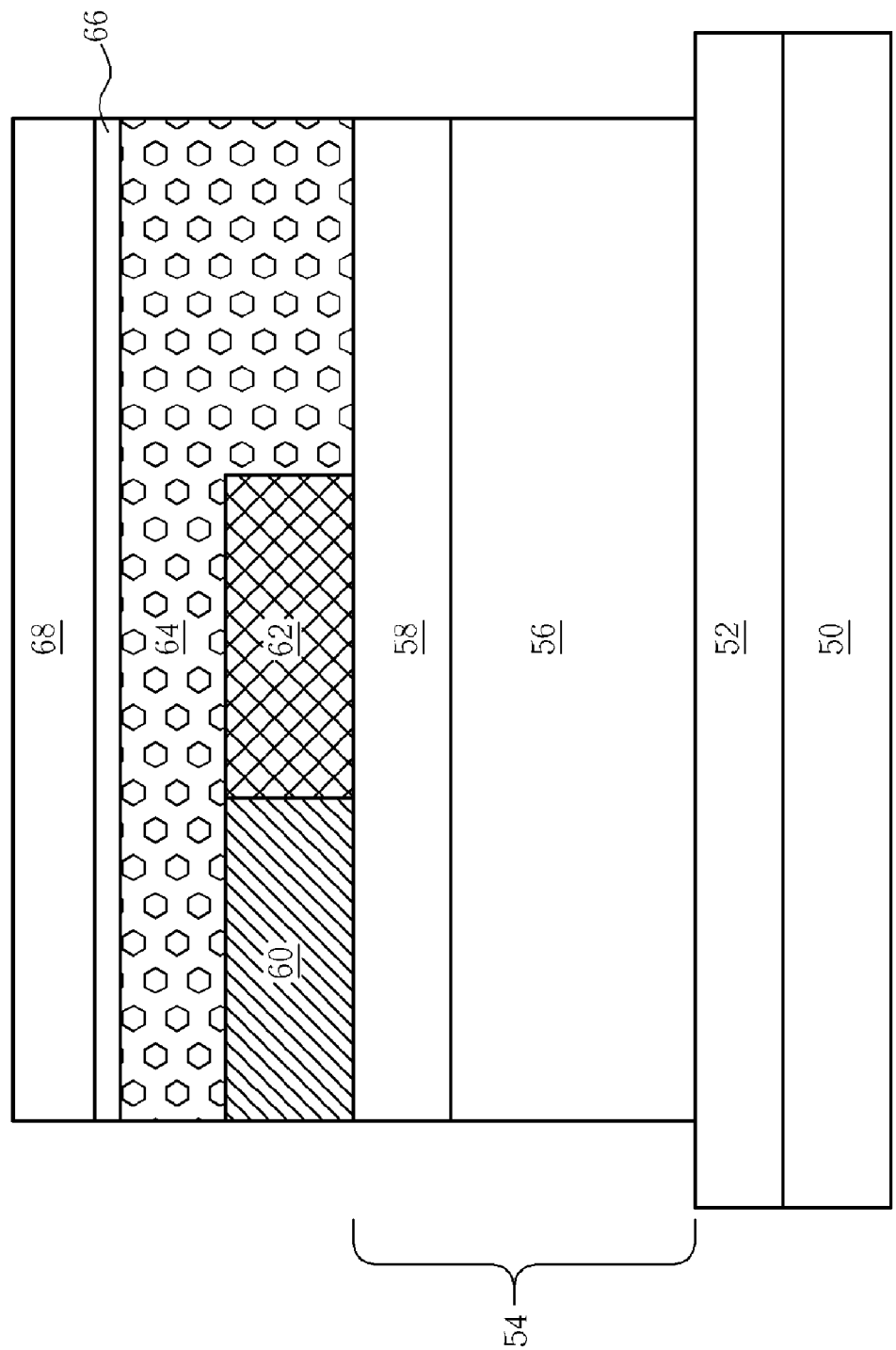
FIG. 8 is a schematic diagram illustrating an organic electroluminescent structure according to another embodiment of the present invention.

In the above-mentioned embodiment, the first primary color, the second primary color and the third primary color are respectively blue, green and red, but applications of the present invention are not limited thereto. The first primary color, the second primary color and the third primary color can respectively be one kind of blue, green and red. In other words, when the host and the dopant match with each other, and the material of each luminescent patterned layer corresponds to the above-mentioned condition, the host also can be doped with the dopant being able to generate blue light or green light. In addition, in this embodiment, the third primary color luminescent and electron transport layer 64 has an uneven top surface, as shown in FIG. 6. But if other conditions need to be considered, such as the consideration of the reflection effect of the second electrode 68, the top surface of the third primary color luminescent and electron transport layer 64 also can be a flatter surface in another embodiment. Please refer to FIG. 8. FIG. 8 is a schematic diagram illustrating an organic electroluminescent structure according to another embodiment of the present invention. In order to easily compare the difference of two embodiments, same devices in FIG. 8 and FIG. 7 use the same numerical label. As shown in FIG. 8, for example, parameters of the evaporation process can be adjusted to make the third primary color luminescent and electron transport layer 64 have a flatter top surface so that the second electrode 68 fabricated as follows also has a flat surface. Otherwise, the parameters of the evaporation process for the second electrode 68 also can be adjusted to make the second electrode 68 have a flat surface.

Figure 9:
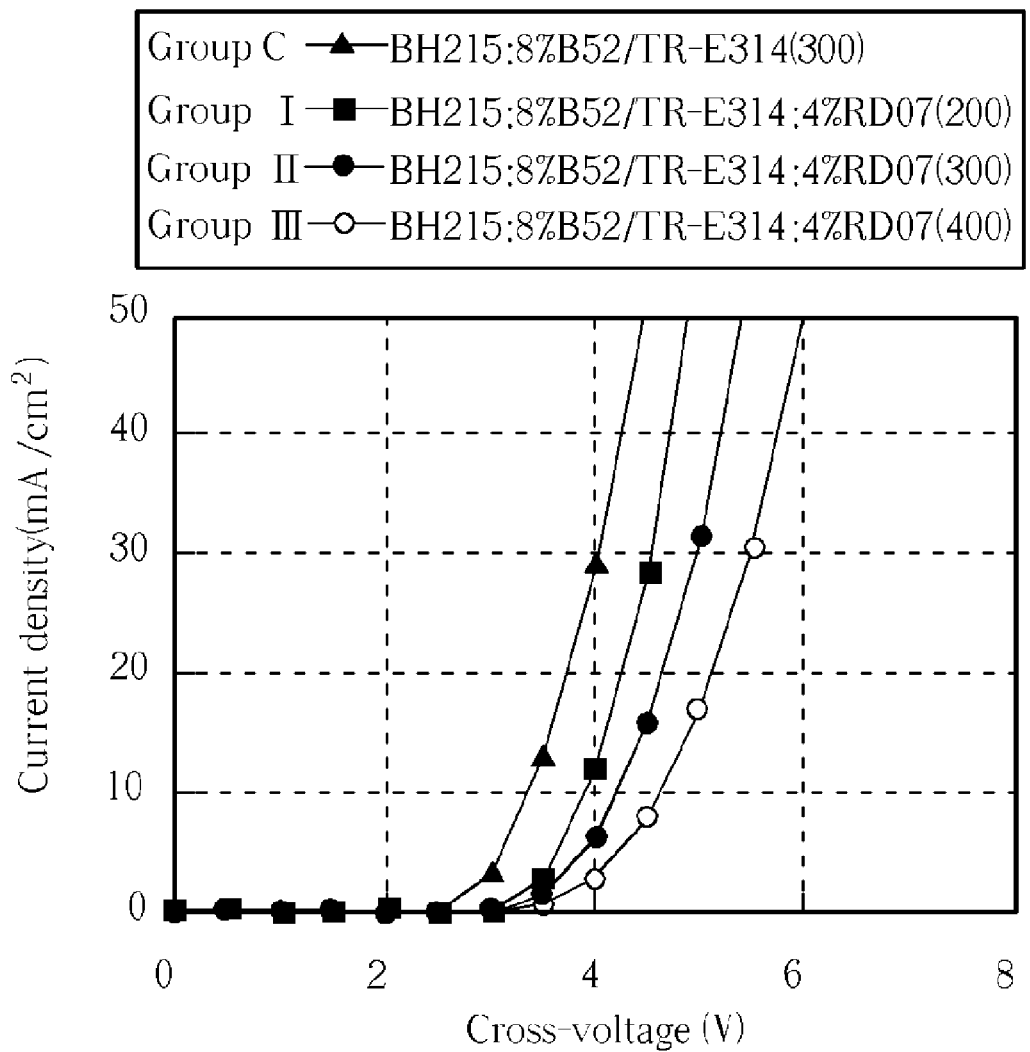
FIG. 9 through FIG. 12 show actual test results according to displaying effect of an organic electroluminescent structure of the present invention.
Figure 10:
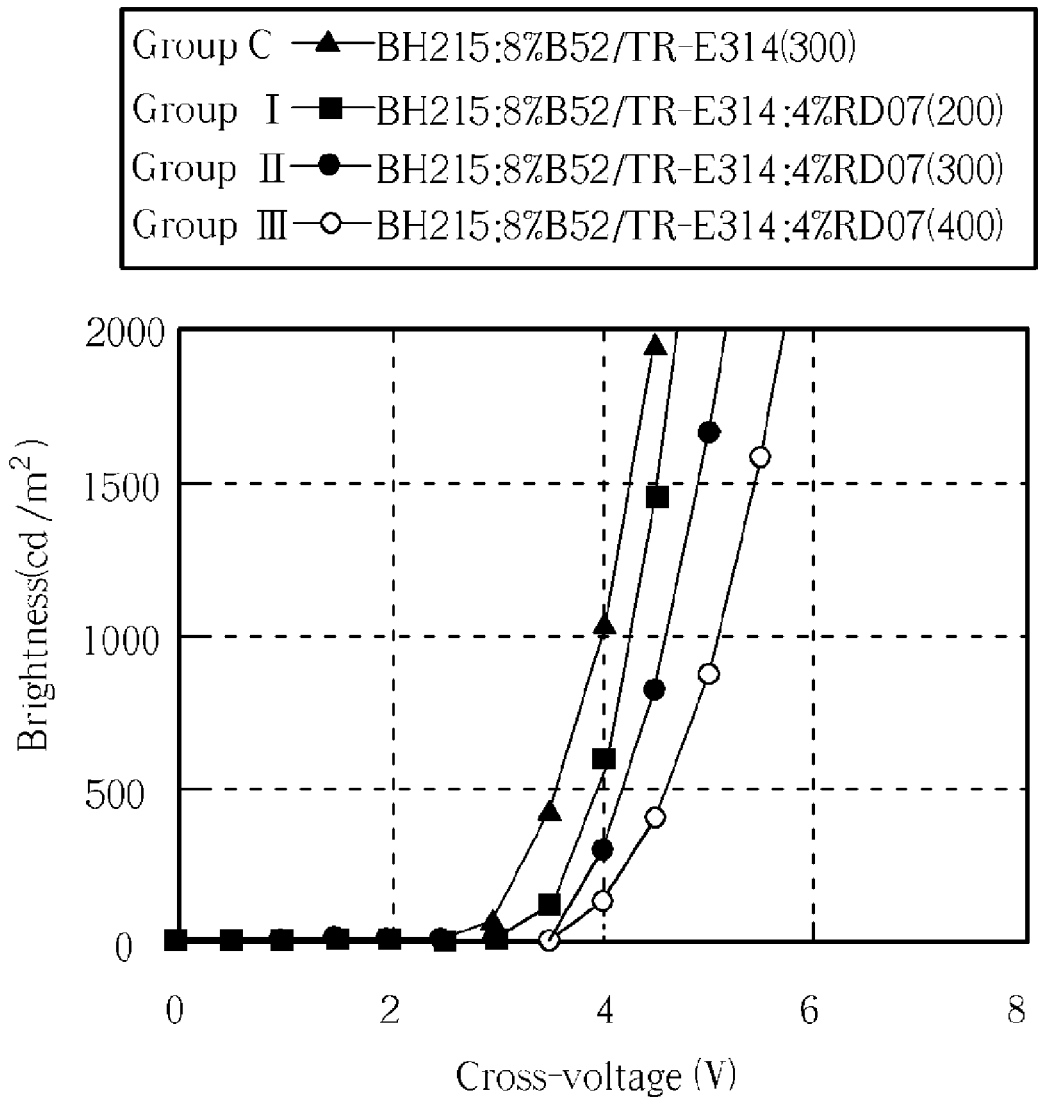
Figure 11:
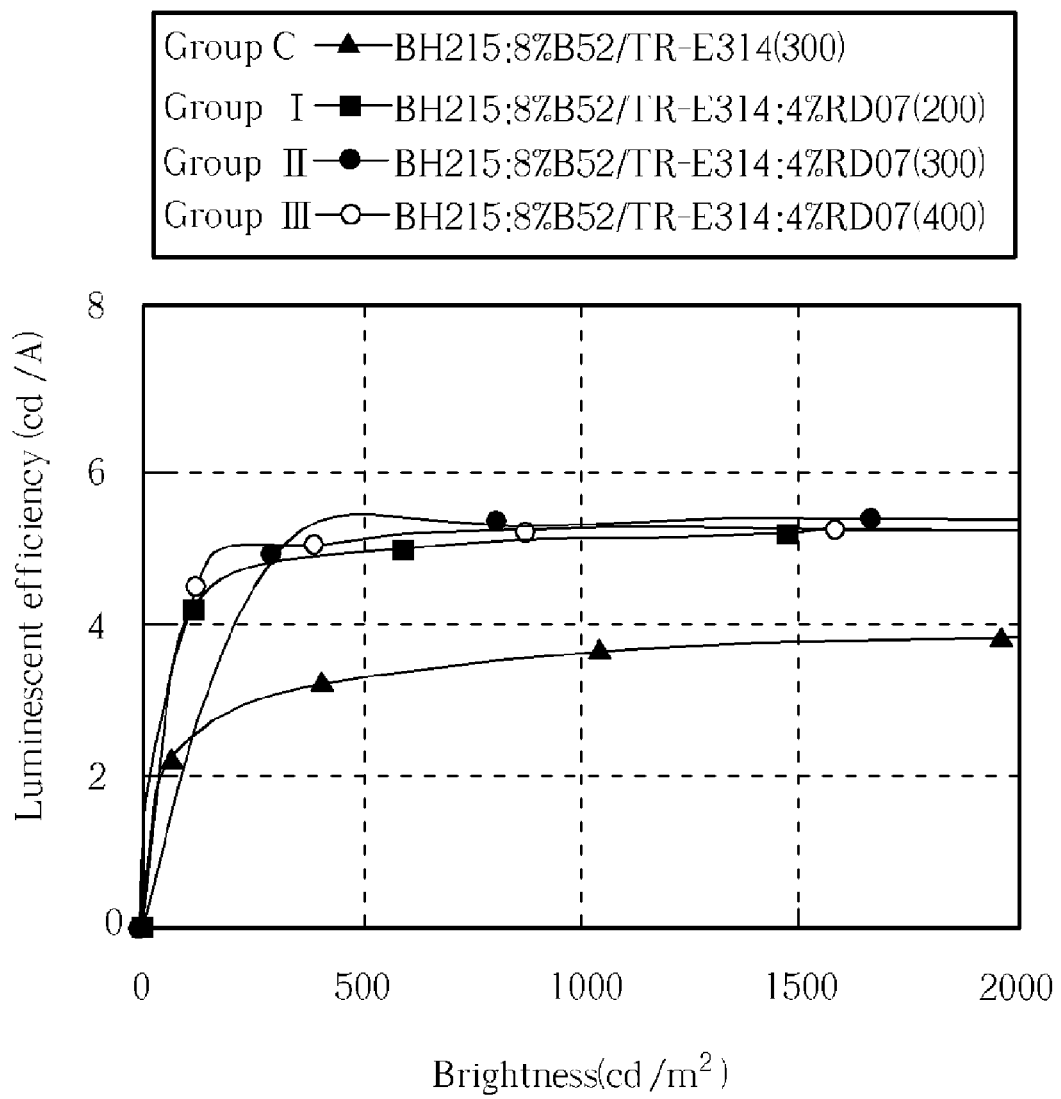
Figure 12:
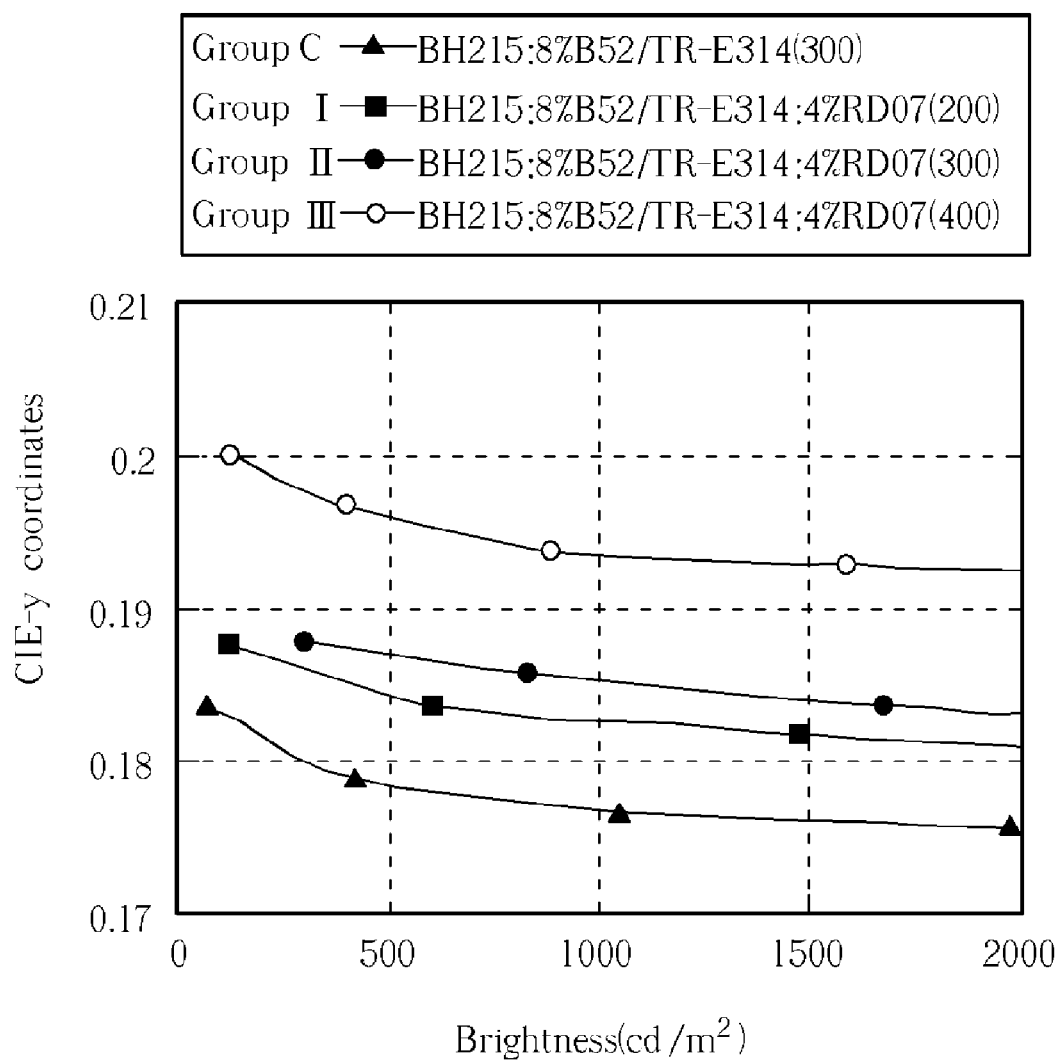

Please refer to FIG. 9 through FIG. 12. FIG. 9 through FIG. 12 show actual test results according to displaying effect of an organic electroluminescent structure of the present invention. FIG. 9 is a relationship diagram illustrating cross-voltage versus current density of the organic electroluminescent structure. FIG. 10 is a relationship diagram illustrating cross-voltage versus brightness of the organic electroluminescent structure. FIG. 11 is a relationship diagram illustrating brightness versus luminescent efficiency of the organic electroluminescent structure. FIG. 12 is a relationship diagram illustrating brightness versus CIE-y coordinates of the organic electroluminescent structure. First, the above-mentioned tests are tested in the blue light region. Each relationship diagram includes a conventional group and three experiment groups, and the conventional group and the experiment groups all use BH215:8% B52 as the material of the blue organic electroluminescent layer. The difference is described as follows.

The conventional group (Group C) is the conventional organic electroluminescent structure using TR-E314 as the material of the electron transport layer, and the thickness of the electron transport layer is 300 angstroms.

The first experiment group (Group I) is the organic electroluminescent structure of the present invention using TR-E314:14.4% RD07 as the material of the red luminescent and electron transport layer, and the thickness of the red luminescent and electron transport layer is 200 angstroms.

The second experiment group (Group II) is the organic electroluminescent structure of the present invention using TR-E315:14.4% RD07 as the material of the red luminescent and electron transport layer, and the thickness of the red luminescent and electron transport layer is 300 angstroms.

The third experiment group (Group III) is the organic electroluminescent structure of the present invention using TR-E315:14.4% RD07 as the material of the red luminescent and electron transport layer, and the thickness of the red luminescent and electron transport layer is 400 angstroms.

FIG. 9 shows the relationship between the cross-voltage and the current density of the organic electroluminescent structure of the present invention. As shown in FIG. 9, in the same current density, the cross-voltage of the organic electroluminescent structure of each experiment group of the present invention compared with the one of the conventional organic electroluminescent structure only increases slightly, so the method of the organic electroluminescent structure of the present invention combining the red luminescent material with the electron transport layer will not obviously affect the power consumption and the lifetime of the organic electroluminescent structure.

FIG. 10 shows the relationship between the cross-voltage and brightness of the organic electroluminescent structure of the present invention. As shown in FIG. 10, in the same brightness, the cross-voltage of the organic electroluminescent structure of each experiment group of the present invention compared with the one of the conventional organic electroluminescent structure only increases slightly, so the method of the organic electroluminescent structure of the present invention combining the red luminescent material with the electron transport layer will not obviously affect the power consumption and the lifetime of the organic electroluminescent structure.

FIG. 11 shows the relationship between the brightness and luminescent efficiency of the organic electroluminescent structure of the present invention. As shown in FIG. 11, in the same brightness, the luminescent efficiency of the organic electroluminescent structure of each experiment group of the present invention compared with the one of the conventional organic electroluminescent structure has an obvious increment.

Otherwise, because the color saturation of the blue light is more relative to the CIE-y coordinate value, FIG. 12 shows the relationship between the brightness and the CIE-y coordinates of the organic electroluminescent structure. As shown in FIG. 12, in the same brightness, such as in the brightness of 1000 cd/m2, the CIE-y coordinate value of the first experiment group and the second experiment group of the present invention is substantially 0.185, but the CIE-y coordinate value of the conventional organic electroluminescent structure is substantially 0.178. Due to the small difference between both, the organic electroluminescent structure of the present invention will not affect the color saturation of the blue light.

As the mentioned above, the organic electroluminescent structure of the present invention dopes the host with the dopant so that the electron transport layer also has a function of some single color luminescent layer besides transporting electrons. The test results further prove that the organic electroluminescent structure of the present invention has better luminescent efficiency. In addition, the organic electroluminescent structure of the present invention also can save one shadow mask in the process. Not only the risk of the alignment deviation can be reduced, but also the problem derived by the shadow mask can be avoided.

Those skilled in the art will readily observe that numerous modifications and alterations of the device and method may be made while retaining the teachings of the invention.

What is claimed is:
1. An organic electroluminescent structure comprising:
a first electrode having a blue light region, a green light region and a red light region;

a blue color luminescent patterned layer disposed on the blue light region of the first electrode for generating a blue color light;

a green color luminescent patterned layer disposed on the green light region of the first electrode adapted for generating a green color light;

a red color luminescent-electron transport layer disposed on the red light region of the first electrode, the blue color luminescent patterned layer, and the green color luminescent patterned layer, the red color luminescent-electron transport layer being for generating a red color light in the red light region and transporting electrons to the blue color luminescent patterned layer in the blue light region and the green color luminescent patterned layer in the green light region, the red color luminescent-electron transport layer comprising a host and a dopant, a highest occupied molecular orbital (HOMO) energy level of the host being lower than or equal to an HOMO energy level of the blue color luminescent patterned layer and an HOMO energy level of the green color luminescent patterned layer, a lowest unoccupied molecular orbital (LUMO) energy level of the host being lower than or equal to an LUMO energy level of the blue color luminescent patterned layer and an LUMO energy level of the green color luminescent patterned layer, an HOMO energy level of the dopant being higher than or substantially equal to the HOMO energy level of the host, the HOMO energy level of the green color luminescent patterned layer, and the HOMO energy level of the blue color luminescent patterned layer, respectively, and an LUMO energy level of the dopant being lower than the LUMO energy level of the host, the LUMO energy level of the green color luminescent patterned layer, and the LUMO energy level of the blue color luminescent patterned layer, respectively; and a second electrode disposed on the red color luminescent-electron transport layer.

2. The organic electroluminescent structure of claim 1, wherein the HOMO energy level of the host is −6.1 eV, and both the HOMO energy level of the blue color luminescent patterned layer and the HOMO energy level of the green color luminescent patterned layer are −5.8 eV.

3. The organic electroluminescent structure of claim 1, wherein the LUMO energy level of the host is −2.8 eV, and both the LUMO energy level of the blue color luminescent patterned layer and the LUMO energy level of the green color luminescent patterned layer are −2.8 eV.

4. The organic electroluminescent structure of claim 1, wherein the HOMO energy level of the host is −6.1 eV, and the HOMO energy level of the dopant is −5.4 eV.

5. The organic electroluminescent structure of claim 1, wherein the LUMO energy level of the host is −2.8 eV, and the LUMO energy level of the dopant is −3.1 eV.

6. The organic electroluminescent structure of claim 1, wherein the red color luminescent-electron transport layer has an uneven top surface facing the second electrode.

7. The organic electroluminescent structure of claim 1 further comprising a hole injection structure disposed between the first electrode and the blue color luminescent patterned layer, the green color luminescent patterned layer and the red color luminescent-electron transport layer.

8. The organic electroluminescent structure of claim 7, wherein the hole injection structure comprises a hole injection layer disposed on the first electrode and a hole transport layer disposed on the hole injection layer.

9. The organic electroluminescent structure of claim 1 further comprising an electron injection layer disposed between the second electrode and the red color luminescent-electron transport layer.

* * * * *